United States Patent
He et al.

(10) Patent No.: US 9,418,900 B1
(45) Date of Patent: Aug. 16, 2016

(54) SILICON GERMANIUM AND SILICON FINS ON OXIDE FROM BULK WAFER

(71) Applicants: INTERNATIONAL BUSINESS MACHINES CORPORATION, Armonk, NY (US); STMicroelectronics, Inc., Coppell, TX (US)

(72) Inventors: Hong He, Schenectady, NY (US); Nicolas Loubet, Guilderland, NY (US); James Kuss, Hudson, NY (US); Junli Wang, Singerlands, NY (US)

(73) Assignees: INTERNATIONAL BUSINESS MACHINES CORPORATION, Armonk, NY (US); STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 14/800,290

(22) Filed: Jul. 15, 2015

(51) Int. Cl.
*H01L 21/8238* (2006.01)

(52) U.S. Cl.
CPC ...... *H01L 21/823878* (2013.01); *H01L 21/823821* (2013.01); *H01L 21/823857* (2013.01); *H01L 21/823864* (2013.01)

(58) Field of Classification Search
CPC .......... H01L 27/1211; H01L 27/823431; H01L 27/823481; H01L 27/845
See application file for complete search history.

(56) References Cited

U.S. PATENT DOCUMENTS

| | | | |
|---|---|---|---|
| 7,993,999 B2 | 8/2011 | Basker et al. | |
| 8,048,723 B2 | 11/2011 | Chang et al. | |
| 8,053,301 B2 | 11/2011 | Jaeger et al. | |
| 8,466,028 B2* | 6/2013 | Yin | H01L 29/66795 438/283 |
| 8,828,818 B1 | 9/2014 | Rodder | |
| 9,093,326 B2* | 7/2015 | Cheng | H01L 27/1211 |
| 9,275,908 B2* | 3/2016 | Kerber | H01L 21/823821 |
| 2014/0015056 A1* | 1/2014 | Fu | H01L 29/66795 257/368 |
| 2014/0061862 A1* | 3/2014 | Vega | H01L 21/3081 257/616 |
| 2014/0099774 A1 | 4/2014 | Vincent | |
| 2014/0170839 A1 | 6/2014 | Brunco | |
| 2014/0264602 A1 | 9/2014 | Basker et al. | |
| 2014/0284719 A1* | 9/2014 | Khakifirooz | H01L 21/845 257/351 |
| 2014/0353760 A1 | 12/2014 | Loubet et al. | |
| 2014/0353767 A1* | 12/2014 | Liu | H01L 21/845 257/401 |
| 2015/0028454 A1 | 1/2015 | Cheng et al. | |

OTHER PUBLICATIONS

Cheng, K., et al. "High Performance Extremely Thin SOI (ETSOI) Hybrid CMOS with Si Channel NFET and Strained SiGe Channel PFET," IEEE International Electron Devices Meeting (IEDM), Dec. 2012. (pp. 1-4).

* cited by examiner

*Primary Examiner* — John P Dulka
(74) *Attorney, Agent, or Firm* — Tutunajin & Bitetto, P.C.; Vazken Alexanian

(57) ABSTRACT

A method for forming fins includes growing a SiGe layer and a silicon layer over a surface of a bulk Si substrate, patterning fin structures from the silicon layer and the SiGe layer and filling between the fin structures with a dielectric fill. Trenches are formed to expose end portions of the fin structures. A first region of the fin structures is blocked off. The SiGe layer of the fin structures of a second region is removed by selectively etching the fin structures from the end portions to form voids, which are filled with dielectric material. The silicon layer of the fin structures is exposed. The SiGe layer in the first region is thermally oxidized to drive Ge into the silicon layer to form SiGe fins on an oxide layer in the first region and silicon fins on the dielectric material in the second region.

20 Claims, 9 Drawing Sheets

SILICON GERMANIUM AND SILICON FINS ON OXIDE FROM BULK WAFER

BACKGROUND

1. Technical Field

The present invention relates to semiconductor processing, and more particularly to methods for forming Si and SiGe fins on a dielectric layer using a bulk wafer.

2. Description of the Related Art

Many fin field effect transistor (finFET) processes begin using thick silicon-on-insulator (SOI) substrates. The processes typically protect N-type field effect transistor (NFET) devices with a SiN hard mask. Fins in an area for P-type field effect transistor (PFET) devices are etched. A high quality undoped SiGe epitaxy is performed to selectively grow SiGe on the etched fins. After the hard mask is stripped from the NFET area, fin patterning and reactive ion etching (RIE) are performed. In many processes, Ge diffuses into NFET areas, which degrades performance of the NFETs. Using the SOI substrate can result in leakage to a base substrate. In addition, before SiGe growth, corners of the fins are susceptible to etching before the SiGe is grown.

SUMMARY

A method for forming fins for complementary metal oxide semiconductor (CMOS) devices includes growing a SiGe layer followed by a silicon layer over a surface of a bulk Si substrate, patterning fin structures from the silicon layer and the SiGe layer and filling between the fin structures with a dielectric fill. Trenches are formed through the dielectric fill, the fin structures and into the substrate. The trenches include a cut perpendicular to the fin structures to expose end portions of the fin structures. A first region of the fin structures is blocked off with a dielectric layer. The SiGe layer of the fin structures of a second region is removed by selectively etching the fin structures from the end portions of the fin structures to form voids. The voids are filled with dielectric material. The silicon layer of the fin structures in the first and second regions is exposed. The SiGe layer in the first region is thermally oxidized to drive Ge into the silicon layer to form SiGe fins on an oxide layer in the first region and silicon fins on the dielectric material in the second region.

Another method for forming fin field effect transistors for complementary metal oxide semiconductor (CMOS) devices includes growing a SiGe layer over a surface of a bulk Si substrate; growing a silicon layer on the SiGe layer; forming a first dielectric layer on the silicon layer; patterning fin structures from the silicon layer and the SiGe layer and filling between the fin structures with a dielectric fill. Trenches are formed through the dielectric fill, the fin structures and into the substrate. The trenches include a cut perpendicular to the fin structures to expose end portions of the fin structures. A first region of the fin structures is blocked off with a second dielectric layer. The method includes removing the SiGe layer of the fin structures of a second region by selectively etching the fin structures from the end portions of the fin structures to form voids; filling the voids with dielectric material; exposing the fin structures in the first and second regions; forming spacers on the fin structures; thermally oxidizing the SiGe layer in the first region to drive Ge into the silicon layer in the first region to form SiGe fins on an oxide layer in the first region and silicon fins on the dielectric material in the second region and removing the spacers.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
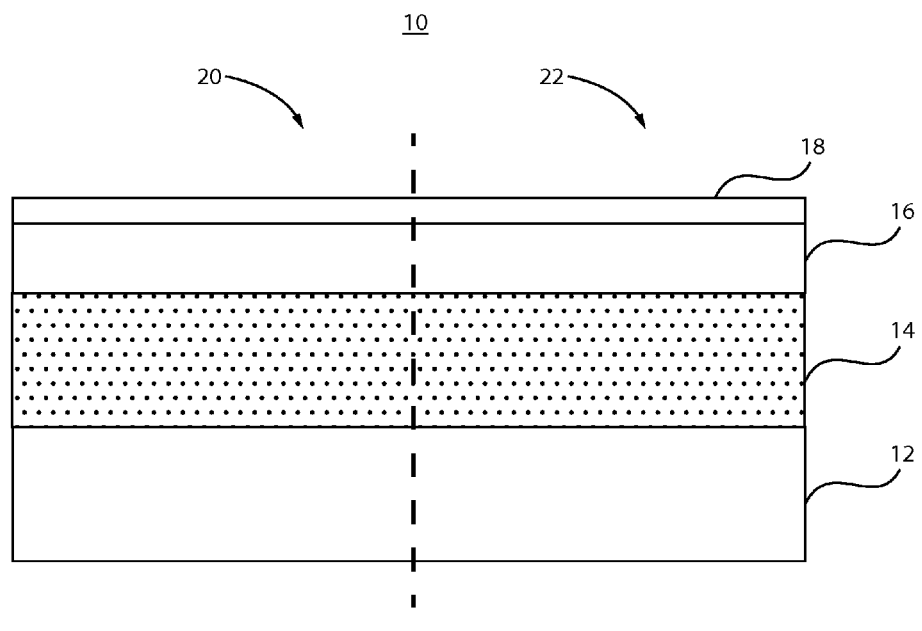
FIG. 1 is a cross-sectional view of a partially fabricated semiconductor device showing a SiGe layer, silicon layer and dielectric layer formed on a bulk substrate in accordance with the present principles.

In accordance with the present principles, complementary metal oxide semiconductor (CMOS) field-effect transistor formation methods are disclosed. In useful embodiments, transistor devices are formed that include fins in silicon with NFET channels and fins in SiGe with PFET channels. The present principles begin with a bulk substrate; however, final transistors will be isolated by a dielectric layer (e.g., an oxide layer), which is similar to silicon-on-insulator (SOI) substrates.

The present principles provide advantages and benefits, some of which include the following. A SiGe channel formed provides high channel mobility for PFET devices. This improves the PFET device performance. The fins are isolated from the substrate (e.g., bulk silicon) by a dielectric material (e.g., silicon oxide ($SiO_2$)). This addresses source to drain punch-through leakage, which can occur with bulk substrates. Beginning the process from a bulk substrate provides wafer commonality across the entire device.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partially fabricated semiconductor device 10 is shown in cross-section. The device 10 includes a bulk silicon (Si) substrate 12, preferably monocrystalline Si although a polycrystalline Si substrate may be employed. The present principles may be applied to other bulk substrate materials as well.

With a bulk Si substrate 12, a silicon germanium (SiGe) or silicon carbide (SiC) layer 14 is epitaxially grown on the bulk substrate 12. The layer 14 is grown everywhere on the bulk substrate 12. A Si epitaxial layer 16 is grown on the layer 14. The layers 14 and 16 are grown across the entire substrate 12, which significantly improves quality of the layer 14 and the Si layer 16. A dielectric layer 18 is formed on the Si layer 18. The dielectric layer 18 may include, e.g., silicon nitride (SiN), or a SiN and silicon oxide ($SiO_2$) bilayer. Other dielectric materials may also be employed. The dielectric layer 18 will be employed for fin patterning. The Si substrate 12 may be conventional (100) with a<110> notched wafer or a<100> notched wafer.

The device 10 is divided into NFET regions 20 and PFET regions 22. The regions 20 and 22 will be processed differently as will be described.

Figure 2:
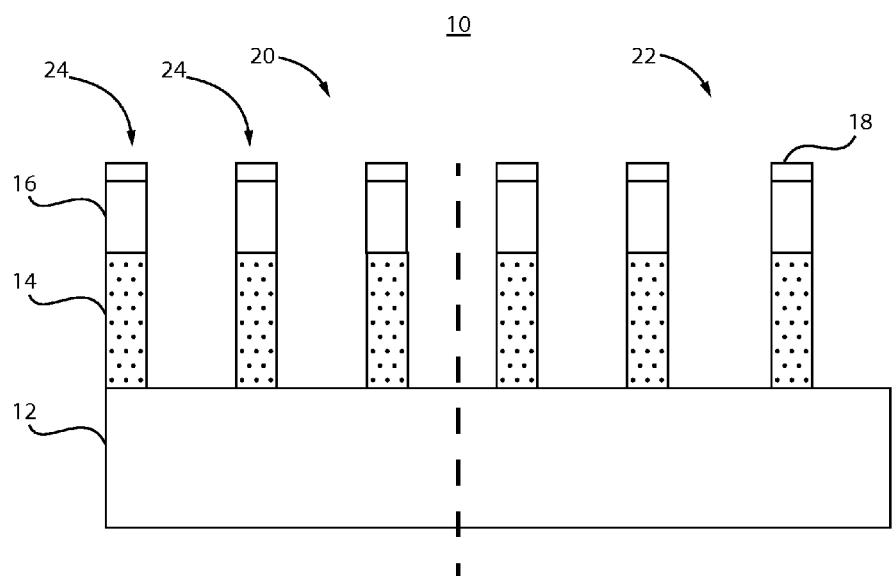
FIG. 2 is a cross-sectional view of the device of FIG. 1 showing fin structures formed from the SiGe layer, the silicon layer and dielectric layer down to the bulk substrate in accordance with the present principles.

Referring to FIG. 2, a fin patterning process is performed. The fin patterning process may include a direct lithographic patterning process or a spacer imaging transfer (SIT) patterning process to remove portions of the layer 18. A reactive ion etch (RIE) process is employed to etch through the Si layer 16 and layer 14 to form fins 24 down to the substrate 12.

Figure 3:
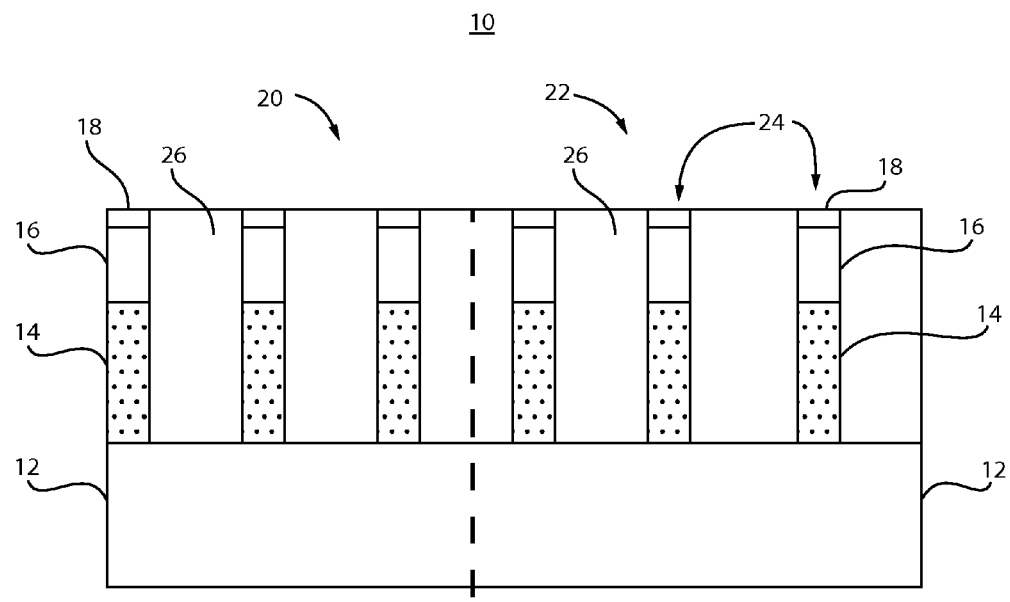
FIG. 3 is a cross-sectional view of the device of FIG. 2 showing the fin structures buried in a dielectric fill in accordance with the present principles.

Referring to FIG. 3, a dielectric layer 26 is deposited. The dielectric layer 26 may include an oxide and, more specifically, a flowable oxide or a high-aspect-ratio process (HARP) oxide film. The dielectric layer 26 is then annealed to densify the layer 26. A planarizing process is performed to planarize the dielectric layer 26, which stops on layer 18. The planarizing process may include, e.g., a chemical mechanical polish (CMP).

Figure 4:
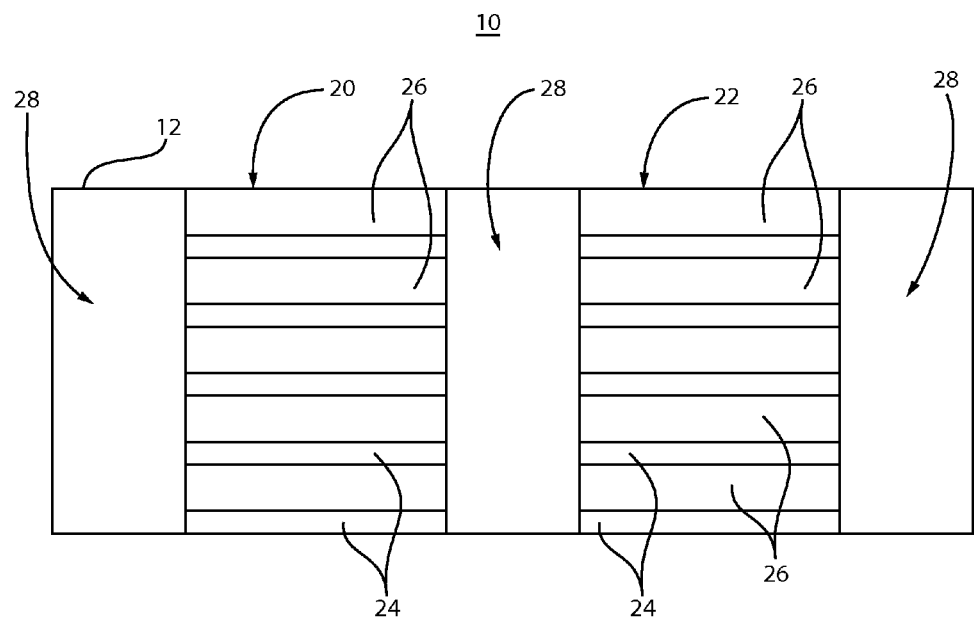
FIG. 4 is a top schematic view of the device of FIG. 3 showing a perpendicular cut through the fin structures, dielectric fill and into the substrate to form trenches in accordance with the present principles.

Referring to FIG. 4, a top schematic view is illustratively shown of the device 10. Deep shallow trench isolation trenches 28 are opened up by etching through the layer 18, the layer 16, the layer 14 and through the dielectric material 26 to reach the substrate 12. The etching continues to remove a portion of the substrate 12 to form the trenches 28. The etching employs a lithographic patterning process. The patterning process is performed to "cut" the fins that are not needed. The fins 24 are cut perpendicular to their longitudinal dimension.

Figure 5A:
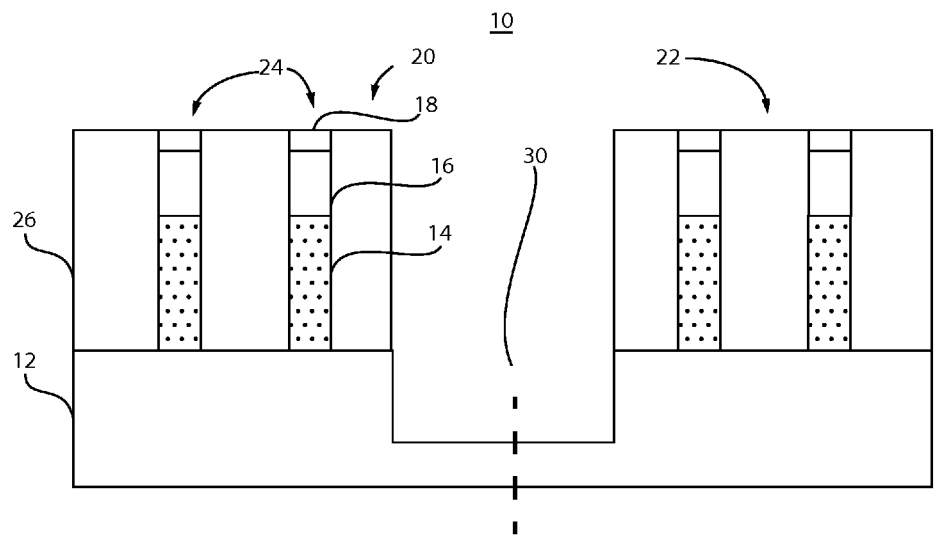
FIG. 5A is a cross-sectional view of the device of FIG. 3 showing a parallel cut through the fin structures, dielectric fill and into the substrate to form trenches in accordance with the present principles.
Figure 5B:
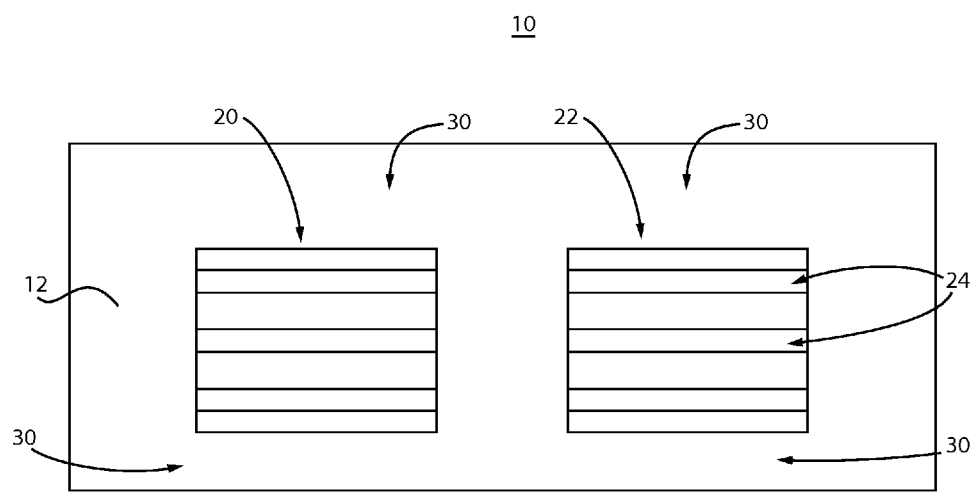
FIG. 5B is a top schematic view of the device of FIG. 4 showing the perpendicular cut through the fin structures, dielectric fill and into the substrate to form trenches in accordance with the present principles.

Referring to FIGS. 5A and 5B, another patterning process is performed to etch through the layer 18, the layer 16, the layer 14 and through the dielectric material 26 to reach the substrate 12. The etching continues to remove a portion of the substrate 12 to form the trenches 30 in an area to parallel to the fins 24. FIG. 5A is a cross-sectional view showing the trenches 30 formed in the substrate 12. FIG. 5B is a schematic top view showing the trenches 30 formed in a parallel directions with the fins 24.

Figure 6A:
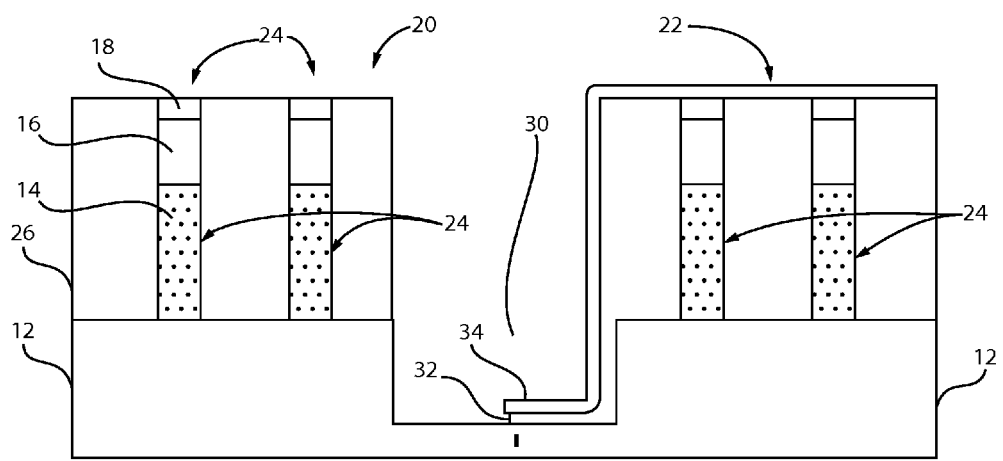
FIG. 6A is a cross-sectional view of the device of FIG. 5A showing a bilayer dielectric blocking a PFET region in accordance with the present principles.
Figure 6B:
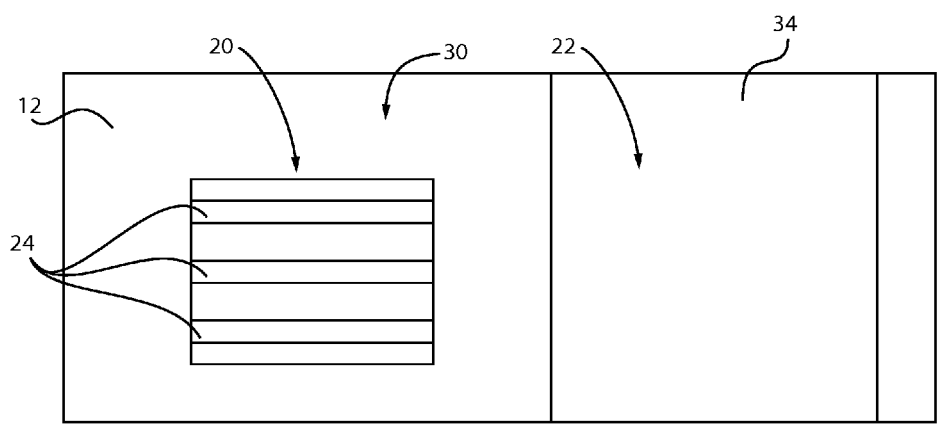
FIG. 6B is a top schematic view of the device of FIG. 5B showing the bilayer dielectric blocking a PFET region in accordance with the present principles.

Referring to FIGS. 6A and 6B, a dielectric layer or layers 32, 34 are formed and patterned to protect the PFET region 22. In one embodiment, the dielectric layers 32, 34 include a Si oxide (32) and Si nitride (34). The dielectric layers 32, 34 are conformally deposited, then a lithographic block is employed to open the NFET region 20. The lithographic process may be employed to remove the SiN layer 34 followed by an HF dip to remove the deposited oxide of layer 32. FIG. 6A is a cross-sectional view showing the PFET region 22 covered. FIG. 6B is a schematic top view showing the PFET region 22 covered.

Figure 7A:
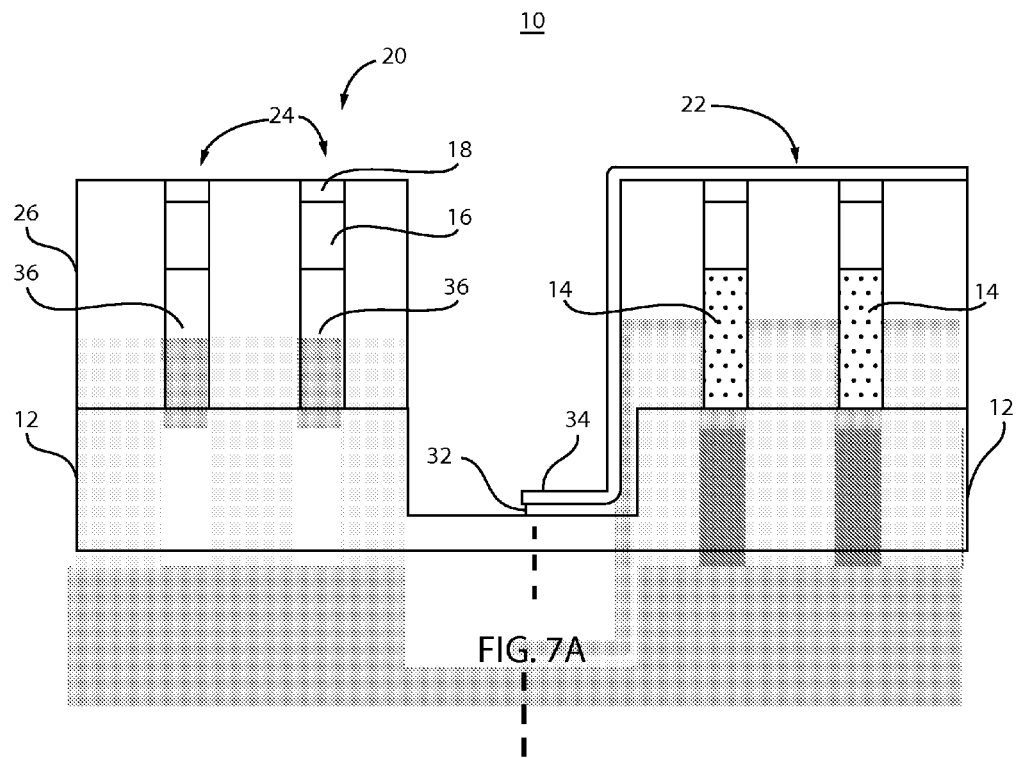
FIG. 7A is a cross-sectional view of the device of FIG. 6A showing the SiGe layer removed from below the silicon layer in an NFET region in accordance with the present principles.
Figure 7B:
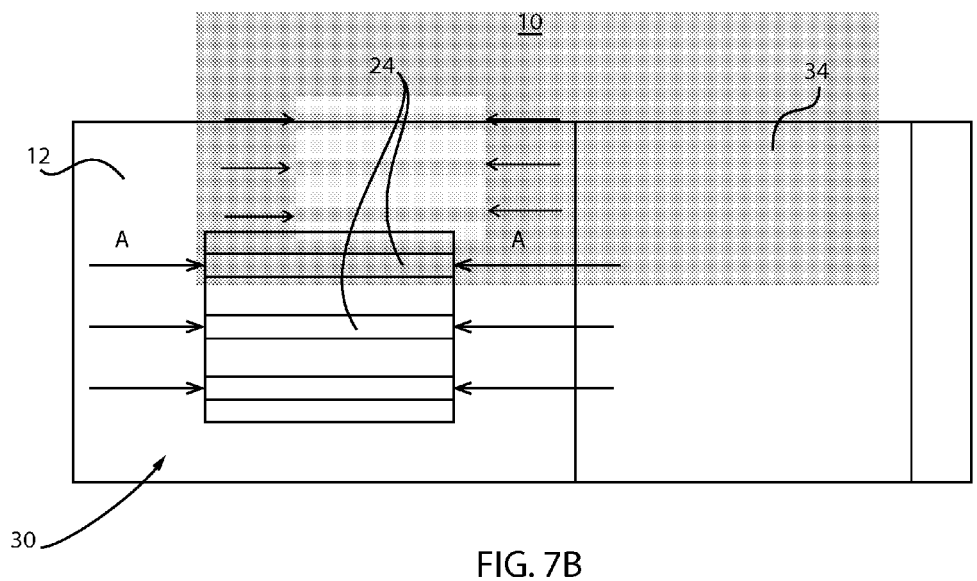
FIG. 7B is a top schematic view of the device of FIG. 6B showing the SiGe layer removed from below the silicon layer in the NFET region in accordance with the present principles.

Referring to FIGS. 7A and 7B, a selective removal of layer 14 in a lower portion of the fins 24 in the NFET region 22 is performed. In one embodiment, layer 14 includes SiGe, and the SiGe removal (under Si layer 16) is provided through sides in a direction of arrows "A" (FIG. 7B) using a wet etch. In one embodiment, the wet etch includes a diluted HCl etch although other etch processes may be employed. The patterning process of FIG. 4 exposes ends of the fins 24. The PFET region 22 is blocked, and a selective etch removes the layer 14 selectively with respect to the Si layer 16 and the dielectric 26. Voids or cavities 36 are formed and are disposed below the fins 24 of the Si layer 16.

Figure 8:
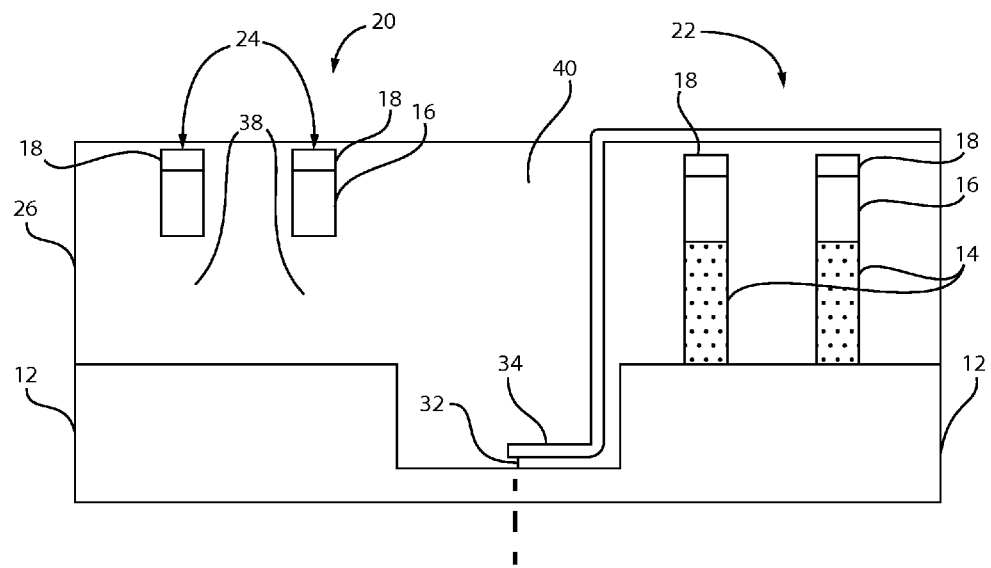
FIG. 8 is a cross-sectional view of the device of FIG. 7A showing voids filled where the SiGe layer was removed from below the silicon layer in the NFET region in accordance with the present principles.

Referring to FIG. 8, a fill process is performed to fill in voids 36 in areas 38 below the fins 24 in the NFET region 20 with a dielectric material 40. The dielectric material 40 may include an oxide, such as silicon oxide, although other suitable materials may be employed. In addition, the trenches 28 and 30 are filled with the dielectric material 40.

The dielectric fill with dielectric material 40 may then be thermally annealed to densify the dielectric material 40. A CMP or other planarizing process may then be performed. The CMP process may stop on the layer 34.

Figure 9:
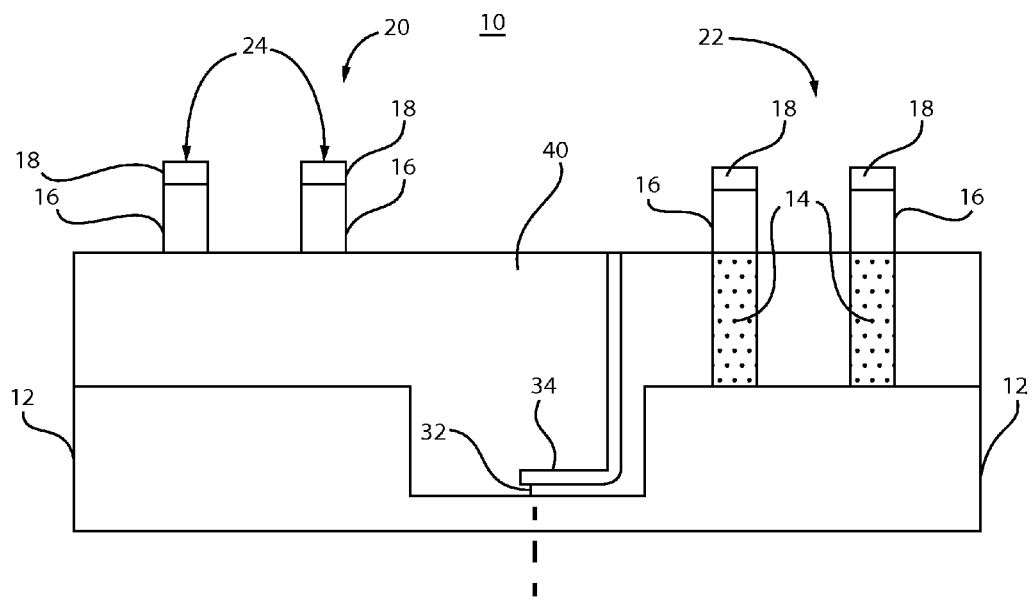
FIG. 9 is a cross-sectional view of the device of FIG. 8 showing the silicon layer portion of the fin structures exposed in the NFET and PFET regions in accordance with the present principles.

Referring to FIG. 9, a recess process is performed to expose the Si layer 16 portion of the fins 24 in both the NFET region 20 and the PFET region 22. In one embodiment, a hot phosphoric acid solution may be employed to remove the layer 34 on the PFET region 22. Next, a RIE etch may be employed to remove layer 32 and further etch dielectric material 40.

Figure 10:
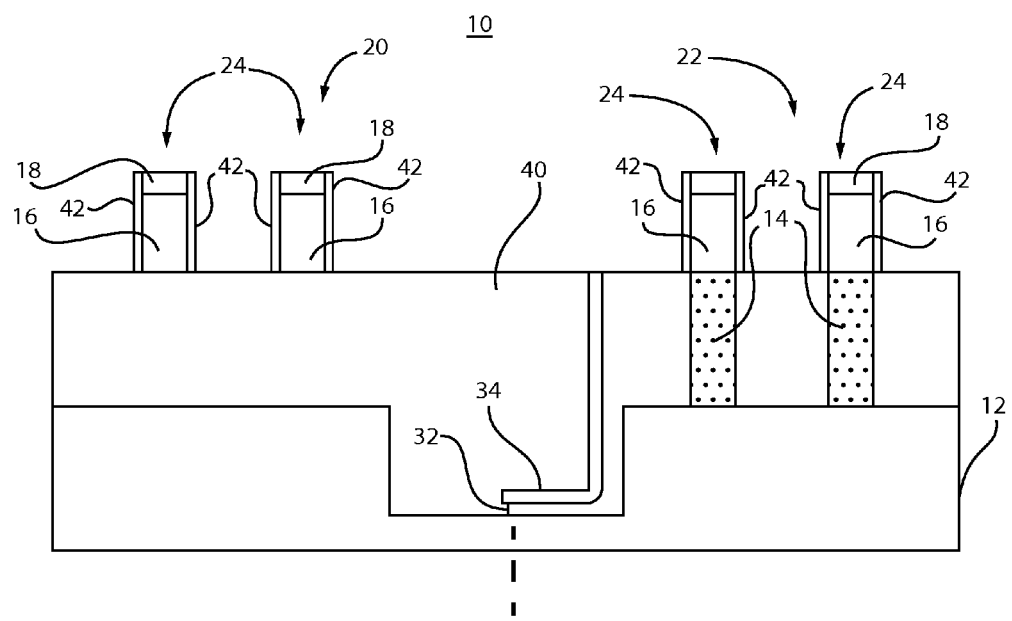
FIG. 10 is a cross-sectional view of the device of FIG. 9 showing spacers formed on the silicon layer portion of the fin structures in the NFET and PFET regions in accordance with the present principles.

Referring to FIG. 10, a spacer layer is formed over the exposed portions of fins 24. The spacer layer may include a silicon nitride (SiN) deposition. The spacer layer is then removed from horizontal surfaces by employing a RIE to form spacers 42.

Figure 11:
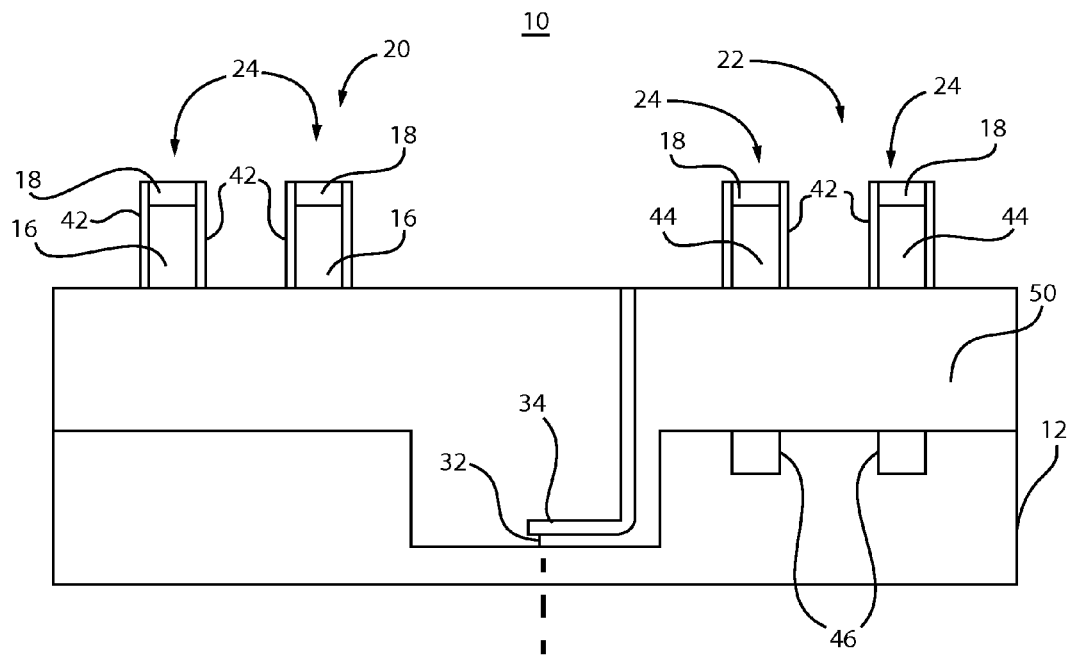
FIG. 11 is a cross-sectional view of the device of FIG. 10 showing SiGe portions of the fin structures in the PFET region converted to oxide and the silicon portion of the fin structures in the PFET region converted to SiGe in accordance with the present principles.

Referring to FIG. 11, a thermal oxidation process is performed to drive materials from the layer 14 into the layer 16 in the PFET region 22. In one embodiment, the layer 14 includes SiGe. The Ge of the layer 14 (FIG. 10) is driven into the Si layer 16 to form SiGe fins 44. In one example, the oxygen combines with the Si of SiGe, and the Ge diffuses into surrounding materials. Some Ge diffuses into the substrate 12 to form regions 46. The portion of layer 14 in region 50 turns to oxide such that silicon fins 24 in the NFET region 20 and the SiGe fins 44 in the PFET region 22, are both formed on a dielectric material (e.g., oxide). The oxidation/condensation process may include a temperature of between about 400 to about 1050 degrees C.

In accordance with the present principles, the fins 24, 44 are formed using a different technique than conventional processing. As such, corner etch issues of the prior art are avoided. In many prior art processes, the fin etch or etching after spacers are formed results in erosion of the fin or the protective qualities of the spacer. The fins 24, 44 are protected for a large portion of the process by layer 18 and the SiGe growth is provided from underneath the fins 44. In accordance with the present embodiments, the erosion issues of the prior art do not arise. In addition, all fins 24, 44 are formed on a dielectric material and are sufficiently electrically isolated from the substrate 12. This helps to reduce current leakage. Since any SiGe was selectively removed from the NFET region 20, Ge diffusion is confined to the PFET region 22. This helps to improve performance of both NFETs and PFETs.

Figure 12:
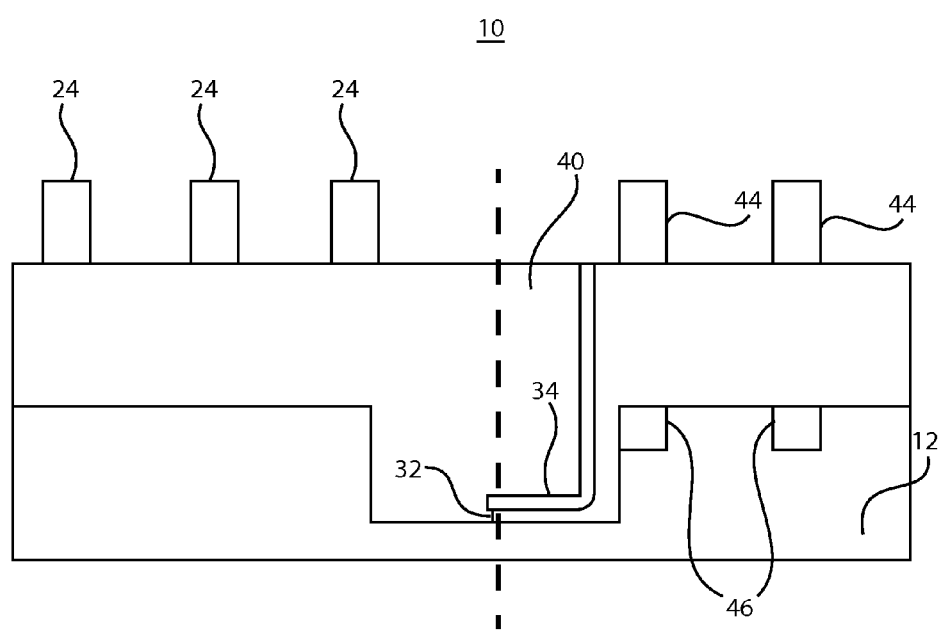
FIG. 12 is a cross-sectional view of the device of FIG. 11 showing silicon fins formed on an oxide layer in the NFET region and SiGe fins formed on the oxide layer in the PFET region in accordance with the present principles.

Referring to FIG. 12, the layer 18 and spacers 42 are removed to provide a structure ready for formation of finFETs. Processing continues with the formation of source and drain regions, gates, contacts, metallizations, etc.

Figure 13:
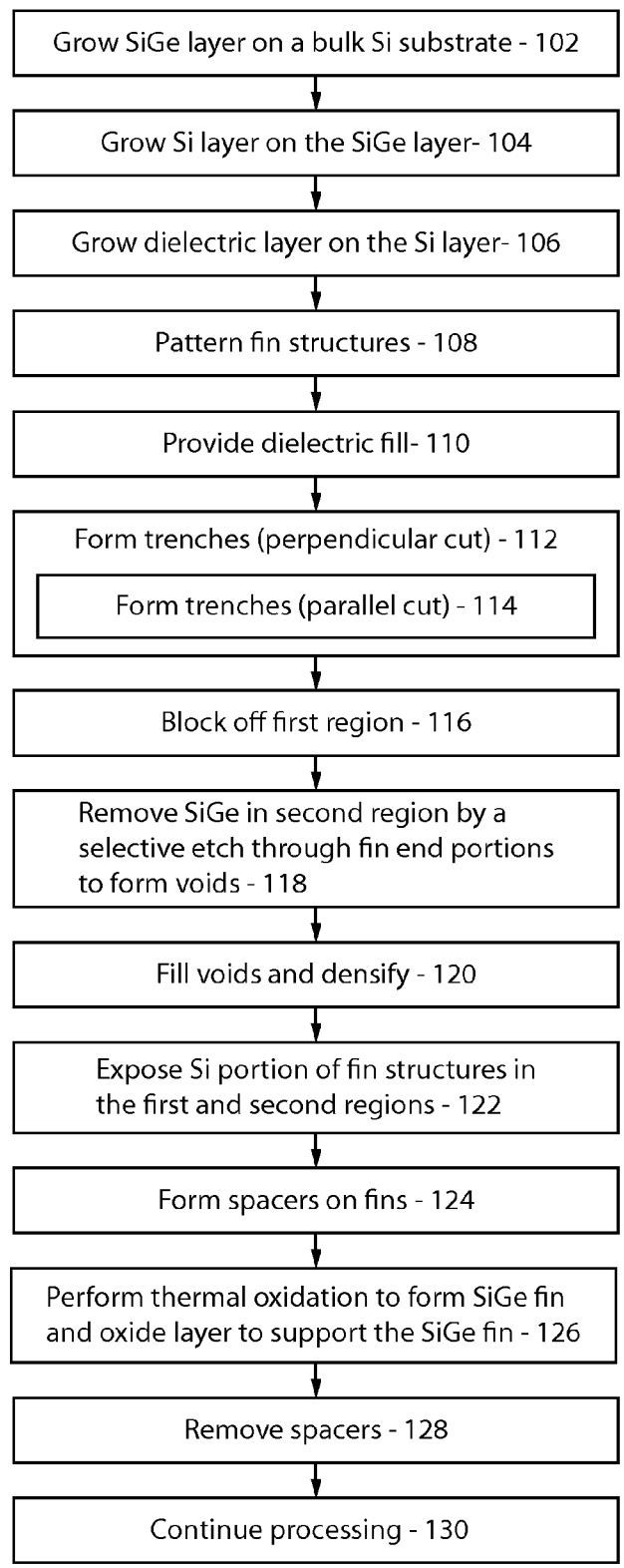
FIG. 13 is a block/flow diagram showing methods for forming fins for complementary metal oxide semiconductor (CMOS) devices in accordance with illustrative embodiments.

Referring to FIG. 13, a method for forming fin field effect transistors for complementary metal oxide semiconductor (CMOS) devices is illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a SiGe layer is epitaxially grown over a surface of a bulk Si substrate. The large area growth (entire or substantially the entire) on the bulk substrate provides a high quality SiGe layer. In block 104, a silicon layer is epitaxially grown on the SiGe layer. In block 106, a first dielectric layer is formed on the silicon layer. The first dielectric layer may include silicon nitride. In block 108, fin structures are patterned from the silicon layer and the SiGe layer. The first dielectric layer is also patterned. In block 110, a dielectric fill fills between the fin structures. The dielectric fill may include a HARP oxide or a flowable oxide. In block 112, trenches are formed through the dielectric fill, the fin structures and into the substrate. The trenches include a cut perpendicular to the fin structures to expose end portions of the fin structures. In block 114, trenches may be formed through the dielectric fill, the fin structures and into the substrate in a direction parallel to the fin structures. This may be performed as a same etch process or a separate etch process from block 112.

In block 116, a first region of the fin structures is blocked off with a second dielectric layer. The first region may include a PFET region. The blocking off may be provided using a bilayer dielectric layer including an oxide layer and a nitride layer.

In block 118, the SiGe layer of the fin structures of a second region is removed by selectively etching the fin structures from the end portions of the fin structures to form voids. This may include performing a wet etch with HCl or other acid. The SiGe layer is removed from below the silicon layer to expose a lower surface of the silicon layer in the fin structures. The second region may include an NFET region. In block 120, the voids are filled with a dielectric material. The material may be densified by an anneal process. In block 122, the fin structures in the first and second regions are exposed. This may be performed by a recess etch, which may include a hot phosphoric acid etch and a RIE. In block 124, spacers may be formed on the fin structures that are exposed.

In block 126, a thermal oxidization process is performed to oxidize the SiGe layer in the first region and to drive Ge into the silicon layer in the first region to form SiGe fins on an oxide layer in the first region and silicon fins on the oxide layer in the second region. This includes converting the SiGe layer to an oxide material to form the oxide layer in the first region. In block 128, the spacers are removed. In block 130, processing continues to form fin FETs and to complete the device.

Having described preferred embodiments for silicon germanium and silicon fins on oxide from bulk wafer (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming fins for complementary metal oxide semiconductor (CMOS) devices, comprising:
   growing a SiGe layer followed by a silicon layer over a surface of a bulk Si substrate;
   patterning fin structures from the silicon layer and the SiGe layer;
   filling between the fin structures with a dielectric fill;
   forming trenches through the dielectric fill, the fin structures and into the substrate, the trenches including a cut perpendicular to the fin structures to expose end portions of the fin structures;
   blocking off a first region of the fin structures with a dielectric layer;
   removing the SiGe layer of the fin structures of a second region by selectively etching the fin structures from the end portions of the fin structures to form voids;
   filling the voids with dielectric material;
   exposing the silicon layer of the fin structures in the first and second regions; and
   thermally oxidizing the SiGe layer in the first region to drive Ge into the silicon layer to form SiGe fins on an oxide layer in the first region and silicon fins on the dielectric material in the second region.

2. The method as recited in claim 1, wherein the first region is configured for P-type field effect transistors (PFETs) and the second region is configured for N-type field effect transistors (NFETs).

3. The method as recited in claim 1, wherein growing the SiGe layer followed by the silicon layer over a surface of a bulk Si substrate includes epitaxially growing the SiGe layer over the entire bulk substrate to provide increased quality of the SiGe layer.

4. The method as recited in claim 1, wherein forming trenches through the dielectric fill includes forming trenches in a direction parallel to the fin structures.

5. The method as recited in claim 1, wherein blocking off the first region of the fin structures with the dielectric layer includes blocking off the first region of the fin structures with a bilayer dielectric layer including an oxide layer and a nitride layer.

6. The method as recited in claim 1, wherein removing the SiGe layer of the fin structures of the second region by selectively etching the fin structures from the end portions includes performing a wet etch with HCl.

7. The method as recited in claim 1, wherein thermally oxidizing the SiGe layer in the first region includes converting the SiGe layer to an oxide material to form the oxide layer in the first region.

8. The method as recited in claim 1, wherein removing the SiGe layer of the fin structures of the second region includes removing the SiGe layer from below the silicon layer to expose a lower surface of the silicon layer in the voids.

9. A method for forming fin field effect transistors for complementary metal oxide semiconductor (CMOS) devices, comprising:
   growing a SiGe layer over a surface of a bulk Si substrate;
   growing a silicon layer on the SiGe layer;
   forming a first dielectric layer on the silicon layer;
   patterning fin structures from the silicon layer and the SiGe layer;
   filling between the fin structures with a dielectric fill;
   forming trenches through the dielectric fill, the fin structures and into the substrate, the trenches including a cut perpendicular to the fin structures to expose end portions of the fin structures;
   blocking off a first region of the fin structures with a second dielectric layer;
   removing the SiGe layer of the fin structures of a second region by selectively etching the fin structures from the end portions of the fin structures to form voids;
   filling the voids with dielectric material;
   exposing the fin structures in the first and second regions;
   forming spacers on the fin structures;
   thermally oxidizing the SiGe layer in the first region to drive Ge into the silicon layer in the first region to form SiGe fins on an oxide layer in the first region and silicon fins on the dielectric material in the second region; and
   removing the spacers.

10. The method as recited in claim 9, wherein the first region is configured for P-type field effect transistors (PFETs) and the second region is configured for N-type field effect transistors (NFETs).

11. The method as recited in claim 9, wherein growing the SiGe layer includes epitaxially growing the SiGe layer over the entire bulk substrate to provide increased quality of the SiGe layer.

12. The method as recited in claim 9, wherein forming trenches through the dielectric fill includes forming trenches in a direction parallel to the fin structures.

13. The method as recited in claim 9, wherein blocking off the first region of the fin structures with the dielectric layer includes blocking off the first region of the fin structures with a bilayer dielectric layer including an oxide layer and a nitride layer.

14. The method as recited in claim 9, wherein removing the SiGe layer of the fin structures of the second region by selectively etching the fin structures from the end portions includes performing a wet etch with HCl.

15. The method as recited in claim 9, wherein thermally oxidizing the SiGe layer in the first region includes converting the SiGe layer to an oxide material to form the oxide layer in the first region.

16. The method as recited in claim 9, wherein removing the SiGe layer of the fin structures of the second region includes removing the SiGe layer from below the silicon layer to expose a lower surface of the silicon layer in the voids.

17. The method as recited in claim 9, further comprising forming source and drain regions.

18. The method as recited in claim 17, wherein the first dielectric layer remains on the silicon layer to protect against fin erosion up the step of forming source and drain regions.

19. The method as recited in claim 9, wherein the first dielectric layer includes silicon nitride.

20. The method as recited in claim 9, wherein filling the voids with dielectric material includes densifying the dielectric material.

* * * * *